United States Patent
Beach et al.

(10) Patent No.: US 7,416,951 B2
(45) Date of Patent: Aug. 26, 2008

(54) THIN FILM RESISTORS INTEGRATED AT TWO DIFFERENT METAL INTERCONNECT LEVELS OF SINGLE DIE

(75) Inventors: Eric W. Beach, Tucson, AZ (US); Vladimir F. Drobny, Tucson, AZ (US); Derek W. Robinson, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 266 days.

(21) Appl. No.: 11/238,715

(22) Filed: Sep. 29, 2005

(65) Prior Publication Data

US 2007/0069334 A1  Mar. 29, 2007

(51) Int. Cl.
*H01L 21/8222* (2006.01)
(52) U.S. Cl. ............... 438/330; 438/384; 257/E21.004
(58) Field of Classification Search ............... 438/171, 438/190, 210, 231, 329–330, 381–382, 384; 257/E21.004
See application file for complete search history.

(56) References Cited

U.S. PATENT DOCUMENTS 4,019,168 A   4/1977   Collins ................. 338/309
6,703,666 B1 *  3/2004   Huttemann et al. ......... 257/359
7,217,981 B2 *  5/2007   Coolbaugh et al. .......... 257/380

* cited by examiner

*Primary Examiner*—Thanhha Pham
(74) *Attorney, Agent, or Firm*—Frederick J. Telecky, Jr.; W. James Brady, III

(57) ABSTRACT

An integrated circuit includes a first thin film resistor on a first dielectric layer. A first layer of interconnect conductors on the first dielectric layer includes a first and second interconnect conductors electrically contacting the first thin film resistor. A second dielectric layer is formed on the first dielectric layer. A second thin film resistor is formed on the second dielectric layer. A third dielectric layer is formed on the second dielectric layer. A second layer of interconnect conductors on the third dielectric layer includes a third interconnect conductor extending through an opening in the second and third dielectric layers to contact the first interconnect conductor, a fourth interconnect conductor extending through an opening in the second and third dielectric layers to contact the second interconnect conductor, and two interconnect conductors extending through openings in the third dielectric layer of the second thin film resistor. A fifth interconnect conductor extends through an opening in the first dielectric layer to contact a circuit element.

8 Claims, 8 Drawing Sheets

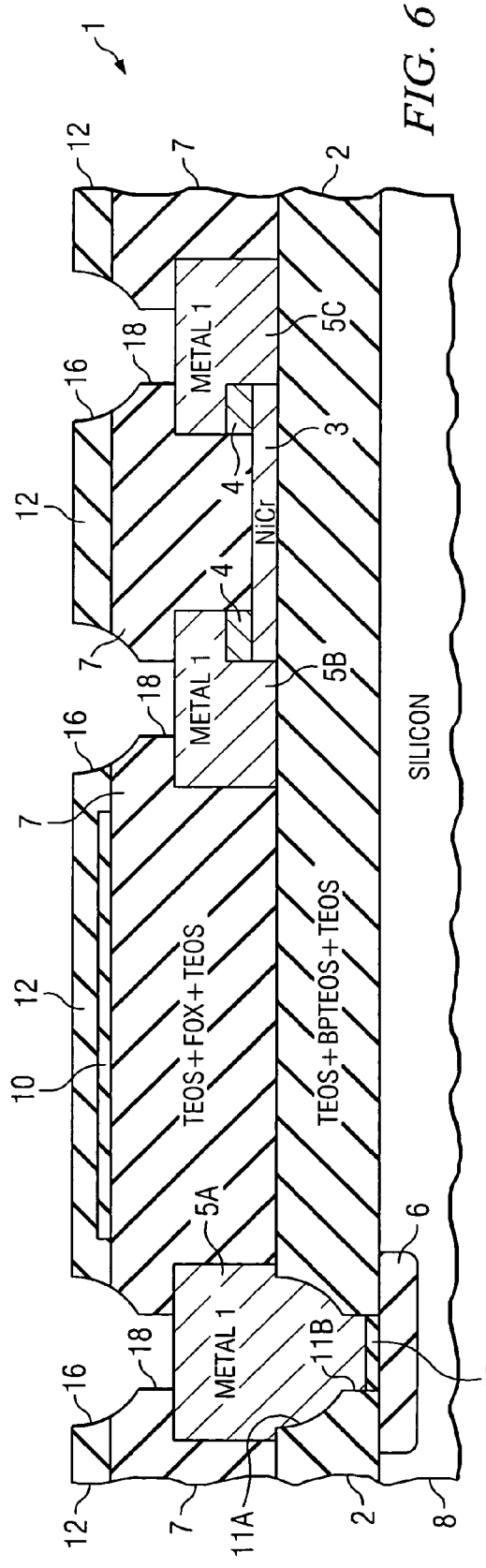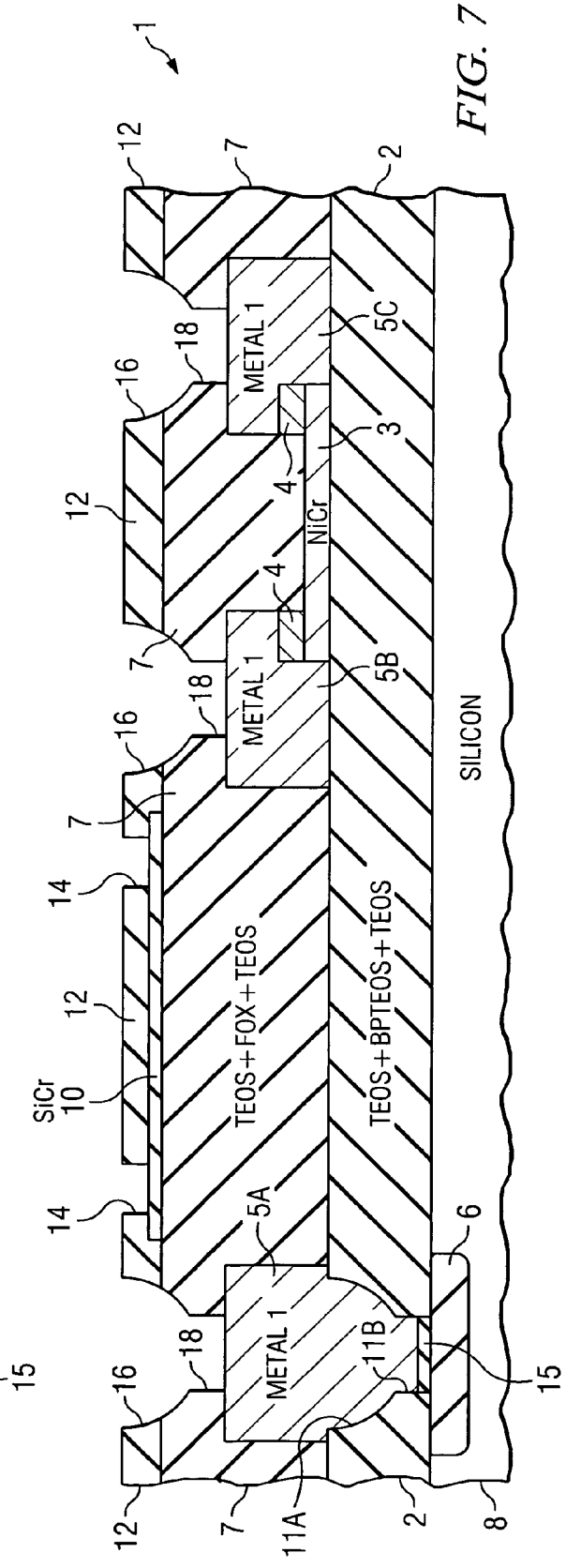

THIN FILM RESISTORS INTEGRATED AT TWO DIFFERENT METAL INTERCONNECT LEVELS OF SINGLE DIE

BACKGROUND OF THE INVENTION

The present invention relates generally to practical thin film resistor structures and methods for integrating multiple thin film resistors of the same or different materials and/or different sheet resistances.

In the past, integrated circuit designers have been limited to one sheet resistance for the thin film resistors integrated into a particular chip. This has necessitated design compromises, especially in the case of laser trimmed high value resistors because in this case the resistors usually are quite narrow. Consequently, the minimum trimmable amount of resistance is a greater proportion of the total resistance, so the accuracy is substantially less for laser trimmed high value resistors unless their width is substantially increased. Also, if the single available sheet resistance is high but the designer needs to provide a low value precision resistor, then the resistor must be made very wide.

It is conventional to adjust the sheet resistance, and also the temperature coefficient of resistance (TCR), of a resistive thin film layer by using suitable thermal anneal cycles to achieve a target sheet resistance for a deposited NiCr or SiCr layer. Once the sheet resistance of a thin film layer is known, the amount of annealing needed to increase its sheet resistance and TCR to target values can be determined from empirical curves.

A typical substrate on which an integrated circuit thin film resistor is formed includes a silicon wafer on which a field oxide is formed. An intrinsic TEOS layer (tetra ethyl ortho silicate layer, which is the liquid precursor used to form the oxides) is formed on the field oxide. A BPTEOS (boron phosphorus doped oxide) layer is formed on the TEOS layer. Another TEOS layer is formed on the BPTEOS layer to keep the doping away from interconnect metallization. The doping referred to is used to lower the re-flow temperature, which improves planarization, and reduces the sharpness of the edges of the oxide steps in the structure. The doping also provides gettering of sodium to keep it and other contaminants away from the transistors previously formed in the silicon substrate. The doping also has been proven to be beneficial in mitigating field oxide threshold problems, thereby preventing parasitic MOS field devices from turning on. The doping also helps in preventing charge-spreading, wherein the field threshold voltage gradually degrades, causing the parasitic MOS field devices eventually to begin to turn on and degrade circuit performance.

Design engineers would be able to better optimize some integrated circuit designs if it were practical and economical to integrate thin film resistors of various sheet resistances into a single integrated circuit structure. However, there has been no practical, economical way to accomplish this because temperature processing cycles associated with forming subsequent thin film resistor layers after formation of a first thin film resistor layer would cause a variety of difficult integrated circuit processing problems. For example, controlling the effect of various thermal cycles on the sheet resistances and TCRs of the multiple thin film resistors formed on successive oxide layers may be very difficult. Also, the presence of metallization layers in integrated structures including thin film resistors on multiple layers may make it very difficult to design subsequent thermal cycles of the kind needed to be compatible with the thin film resistor properties.

U.S. Pat. No. 4,019,168 entitled "Bilayer of Thin Film Resistor and Method for Manufacture", issued Apr. 19, 1977 to Franklyn M. Collins, describes an integrated circuit structure including a layer of tantalum on a layer of nichrome for the purpose of stabilizing the sheet resistance of the nichrome. However, the foregoing patent is not directed to issues regarding processing problems associated with forming multiple thin film resistors on different oxide layers in an integrated circuit structure.

Prior art structures that include interconnected polycrystalline silicon resistors and diffused resistors are well known. However, such structures including polycrystalline silicon resistors and diffused resistors do not meet many of the needs of modern integrated circuit design. Although it is highly desirable to provide a TCR value of zero for polycrystalline silicon resistors and diffused resistors, as a practical matter this is difficult to achieve. In contrast, it is relatively easy to achieve the TCR of zero in thin film resistors for most sheet resistances. Diffused resistors have high voltage coefficients, due to their associated voltage-dependent depletion regions which cause the resistance to change as a function of voltage applied across the diffused resistor. Also, high precision resistance values and precise ratio-matching are much more difficult to achieve for polycrystalline resistors and diffused resistors than is the case for thin film resistors.

There is an unmet need for a practical integrated circuit structure and method for providing different thin film resistors composed of different materials and/or of different sheet resistances, each thin film resistor being on a different oxide layer.

There also is an unmet need for a practical integrated circuit structure and method for providing different thin film resistors composed of different materials wherein the sheet resistance of one of the thin film resistors can be adjusted without unacceptably changing the sheet resistance of the other thin film resistor.

SUMMARY OF THE INVENTION

It is an object of the invention to provide a practical integrated circuit structure and method for providing different thin film resistors composed of the same or different materials and/or of different sheet resistances, each thin film resistor being on a different oxide layer.

It is another object of the invention to provide a practical integrated circuit structure and method for providing different thin film resistors composed of the same or different materials wherein the sheet resistance of one of the thin film resistors can be adjusted without unacceptably changing the sheet resistance of the other thin film resistor.

Briefly described, and in accordance with one embodiment, the present invention provides an integrated circuit structure including a first dielectric layer (2) disposed on a semiconductor layer (8), a first thin film resistor (3) disposed on the first dielectric layer (2), a first layer (Metal 1) of interconnect conductors (5A,5B,5C) disposed on the first dielectric layer (2) including a first interconnect conductor (5B) contacting a first contact area of the first thin film resistor (3) and a second interconnect conductor (5C) contacting a second contact area of the first thin film resistor (3). A second dielectric layer (7) is disposed on the first dielectric layer (2), the first thin film resistor (3), and the first layer of interconnect conductors (5,5A), and a second thin film resistor (10) is disposed on the second dielectric layer (7). A third dielectric layer (12) is disposed on the second dielectric layer (7) and the second thin film resistor (10). A second layer (Metal 2) of interconnect conductors (23,23A,24) is disposed on the third dielectric layer (12) including a third interconnect conductor (23) extending through a corresponding opening (16,18) in the second (7) and third (12) dielectric layers to contact the first interconnect conductor (5B), a fourth interconnect conductor (23A) extending through a corresponding opening (16,18) in the second (7) and third (12) dielectric layers to contact the second interconnect conductor (5C), and two interconnect conductors (23, 24) extending through corresponding openings (14) in the third dielectric layer (12) to first and second contact areas, respectively, of the second thin film resistor (10).

In one embodiment, the integrated circuit structure includes a circuit element (6) disposed in the semiconductor layer (8) and a fifth interconnect conductor (5A) extending through a corresponding opening (11A,11B) in the first dielectric layer (2) and contacting a contact area of the circuit element (6). The first thin film resistor (3) is composed of nichrome and the second thin film resistor (10) is composed of sichrome. A metal silicide layer (15) is disposed between the third interconnect conductor (5A) and the contact area of the circuit element (6).

BRIEF DESCRIPTION OF THE DRAWINGS

FIGS. 1-9 schematically illustrate nine intermediate structures successively produced by a sequence of successive process steps in the formation of a thin film resistor structure according to the present invention.

DETAILED DESCRIPTION OF THE PREFERRED EMBODIMENTS

FIGS. 1-9 illustrate a sequence of diagrams illustrating formation of an integrated circuit structure 1 after each of a number of processing operations according to the invention for fabricating a thin film resistor structure including two thin film resistors which may be composed of different thin film material typically having different sheet resistances on different dielectric layers.

Figure 1:
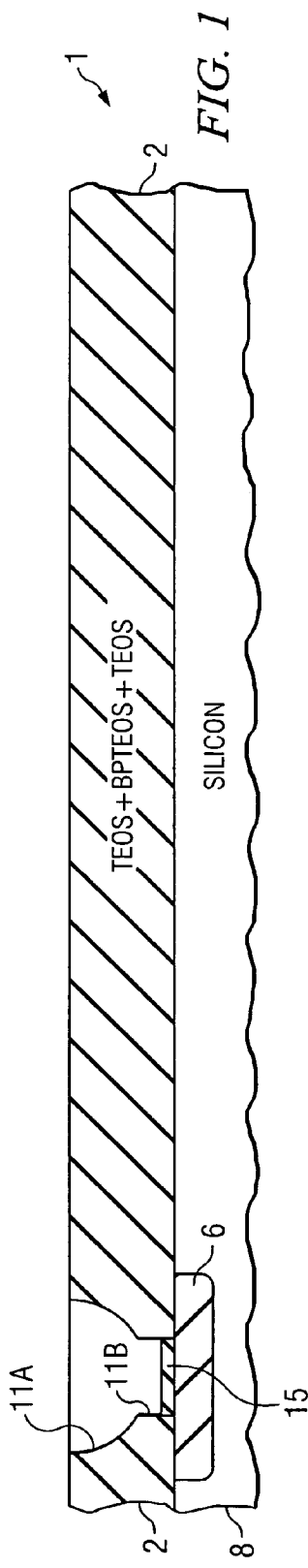

FIG. 1 shows a preliminary integrated circuit substructure 1 including a starting silicon layer 8, which typically has formed therein various circuit components 6. A typical field oxide (not shown) also is present on the preliminary integrated circuit substructure shown in FIG. 1. A standard pre-metal dielectric layer 2 has been deposited on the foregoing preliminary substructure. Circuit components 6 may include active circuit components such as transistors and passive circuit components such as diffused/implanted resistors. Pre-metal dielectric layer 2 includes a TEOS (tetraethylorthosilicate) layer on the above-mentioned substructure, a BPTEOS (Boron-Phosphorus TEOS) layer on the first TEOS sublayer, and a second TEOS layer on the BPTEOS sublayer.

A contact opening 11A,11B extending through pre-metal dielectric layer 2 is formed using a two-part etching procedure using a single mask. (An opening through a dielectric layer to allow subsequently deposited metallization to contact a silicon electrode is commonly referred to as a "contact opening", whereas an opening through a dielectric layer to contact another metal layer or a thin film resistor is commonly referred to as a "via opening". However, the term "contact opening" may encompass both types of openings.) The first part of the etching procedure is an isotropic etch, which forms a somewhat rounded portion 11A of the contact opening, as shown. The second part of the contact opening etching procedure is formed by an anisotropic etch which forms the "stem" portion 11B of the via opening.

Then a layer 15 of vanadium is formed on the bottom of the contact opening or via opening 11A, 11B for the purpose of forming vanadium silicide by means of a conventional deposition, anneal, and stripping technique, to provide good contact to the silicon electrode in region 6.

Figure 2:
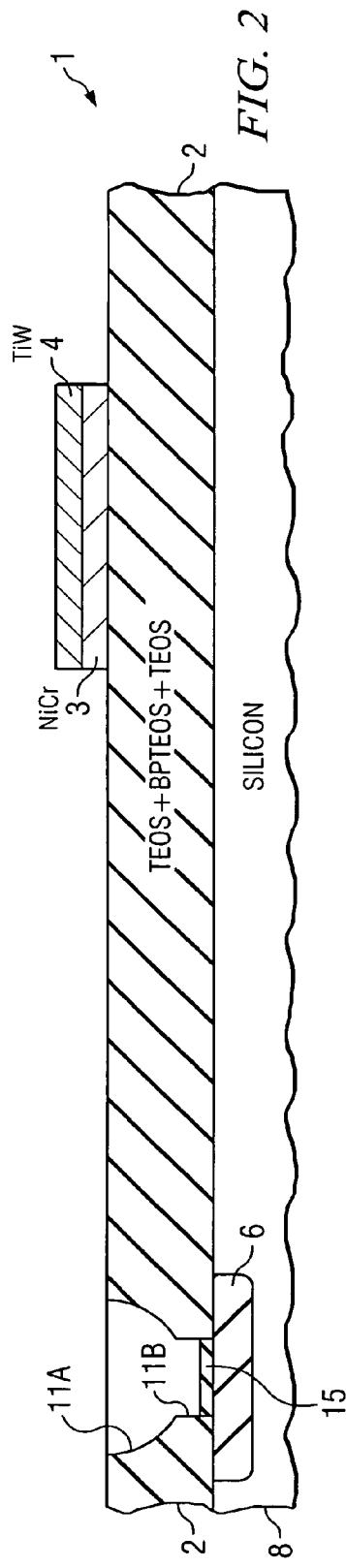

Referring to FIG. 2, a thin layer 3 of nichrome (NiCr or NiCrAl or other nichrome alloy) having a sheet resistance typically in the range from 30 to 300 ohms per square has been deposited on the upper surface of pre-metal dielectric layer 2. A thin layer of titanium-tungsten 4 has been deposited on NiCr resistor 3. The mask images of the nichrome and titanium-tungsten layers are simultaneously imaged onto the integrated circuit prior to the depositions of the nichrome and the titanium-tungsten. The nichrome resistor sizes and shapes have been determined by a titanium-tungsten/nichrome etching process. A barrier metal layer 4 of titanium-tungsten is deposited over the structure to serve as a diffusion barrier between nichrome resistor 3 and the subsequently deposited Metal 1. During the completion of the Metal 1 etch process, the barrier metal layer 4 protects the nichrome resistor 3 from damage during the chlorinated plasma portion of the etchant utilized to pattern the Metal 1 layer.

Figure 3:
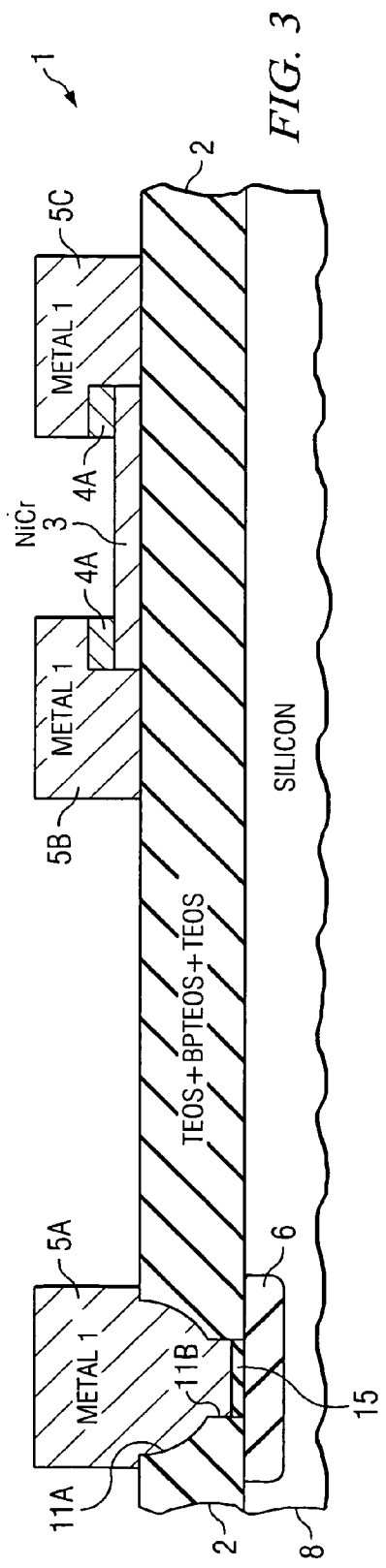

Referring to FIG. 3, the above mentioned "Metal 1" layer, which can be composed of aluminum with 0.5% copper, is deposited and followed by conventional photolithography to define the sizes and shapes of various conductors, for example, conductors 5A-5C, wherein first a chlorinated plasma etches portions of the aluminum metal to define the shapes of conductors 5A-5C. Then the etching plasma is switched from chlorinated plasma to a fluorinated plasma, which etches away the titanium-tungsten over the body of the NiCr resistor except the metal contact areas 4A between metal conductors 5B and 5C and the contact areas at the ends of NiCr resistor 3. (The fluorine in the plasma displaces chlorine, which prevents subsequent corrosion that otherwise could be caused by remaining chlorine.)

Some of the conductors, such as conductor 5A, of the Metal 1 layer extend through the contact openings in pre-metal dielectric layer 2 to make contact to electrodes of circuit elements such as circuit element 6. Other conductors, such as conductors 5B and 5C, make good electrical contact to the portions of titanium-tungsten layer 4 which remain on the contact areas at the ends of NiCr resistor 3.

After the Metal 1 layer is formed, an anneal operation is performed, partly in forming gas and partly in oxygen. This annealing increases the sheet resistance of nichrome resistor 3, for example, from about 37 ohms per square to about 50 ohms per square. Conventional rapid thermal anneal (RTA) technology or conventional tube annealing can be used to accomplish the annealing cycle.

Figure 4:
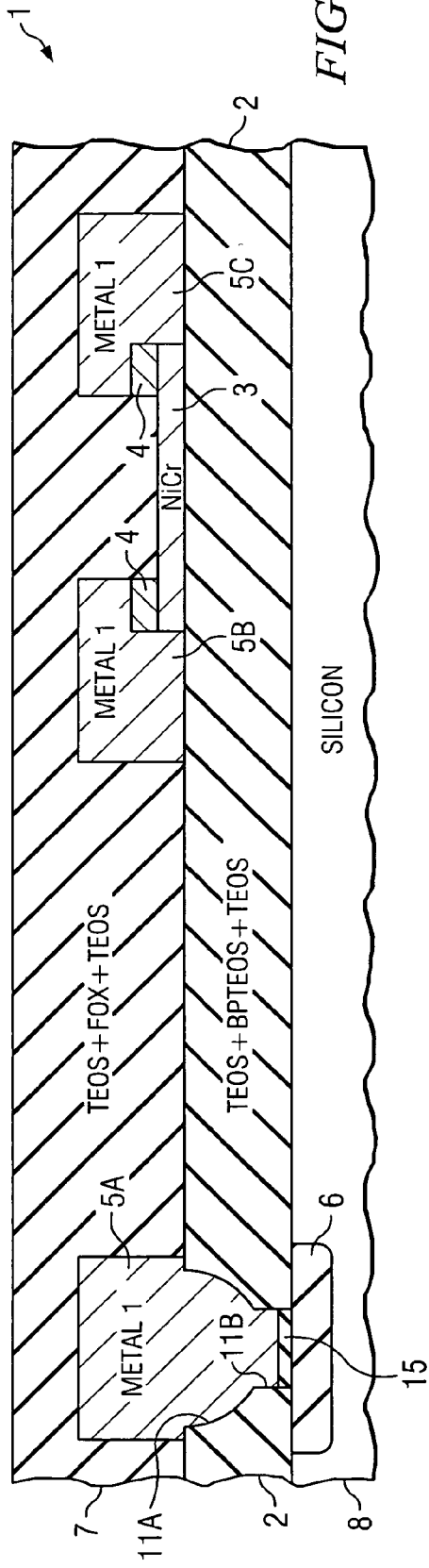

Referring to FIG. 4, an inter-metal dielectric layer 7 is formed on the exposed substructure surface area including the exposed area of pre-metal dielectric layer 2, the Metal 1 conductors 5A-5C, and the exposed area of nichrome resistor 3. Inter-metal dielectric layer 7 is formed by first depositing a plasma-enhanced TEOS sublayer, followed by a application of a flowable spin-on oxide (trademark FOx), which helps to planarize the integrated circuit chip surface. (The trademark FOx refers to "flowable oxide", belongs to Dow Corning, and is composed of hydrogen silsesquioxane ($HSiO_{3/2}$). Then the structure of FIG. 4 is annealed in the presence of nitrogen gas or other suitable ambient. Then intermetal dielectric layer 7 is completed by depositing a TEOS "cap" layer on the spin-on oxide sublayer.

Figure 5:
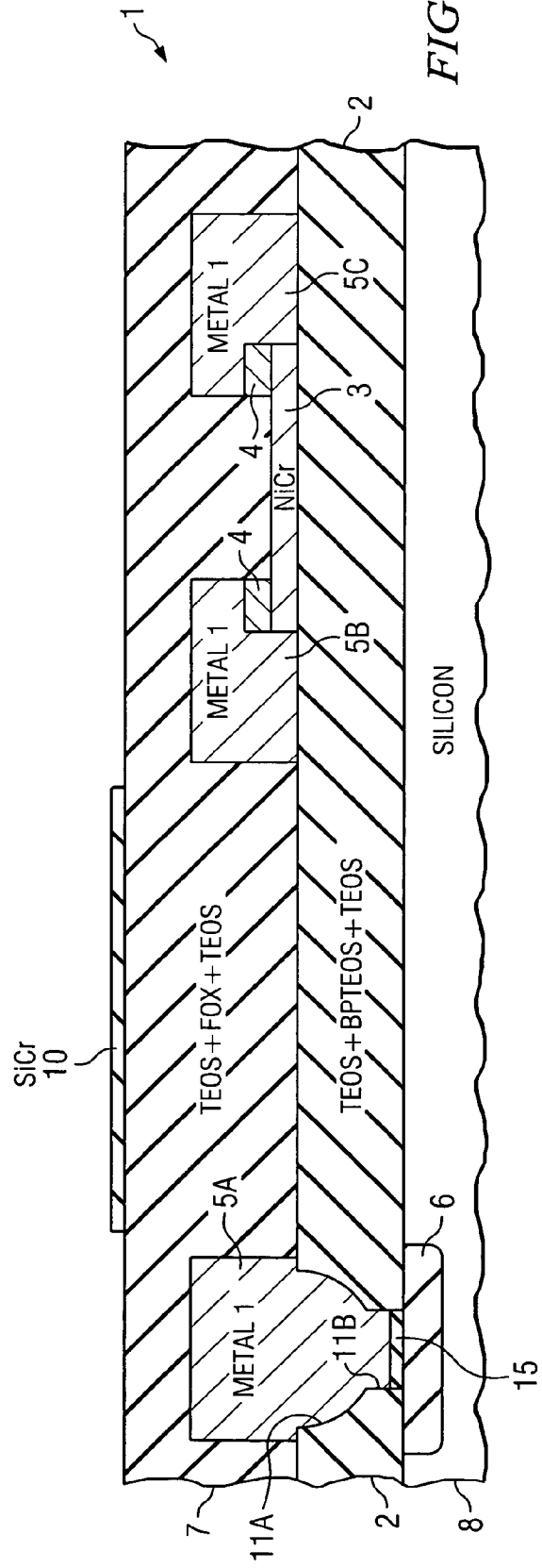

As indicated in FIG. 5, a thin (e.g., 38 Angstrom) sichrome film resistor layer then is deposited on intermetal dielectric layer 7. Conventional photolithography steps and a dry etch step are performed to define the size and shape of a sichrome resistor 10. A nitrogen or argon anneal process can be performed, for example at a temperature of 470 degrees Centigrade for a period of 30 minutes, to lower the sichrome sheet resistance from about 1150 ohms per square to about 1000 ohms per square and to adjust the TCR, wherein the nitrogen or argon prevents oxide formation and associated contact resistance.

The sheet resistance of sichrome resistor 10 typically is much higher than that of earlier-deposited NiCr resistor 3. The nichrome layer typically is annealed to decrease its sheet resistance and to increase its TCR to desired target values. Preferably, however, the high-sheet-resistance second-deposited sichrome layer is deposited with high precision sheet resistance value and does not require annealing. It should be appreciated that if the sichrome layer were to be annealed at a high temperature for a long duration, that might result in difficult-to-control changes in the sheet resistance (and TCR) of the previously-deposited NiCr layer 3. After the annealing, sichrome resistor 10 may be a high precision resistor having a sheet resistance near 1000 ohms per square (although it could be in the range of approximately 300-2000 ohms per square), typically with a TCR of approximately 0 parts per million (ppm).

Referring to FIG. 6, a very thin TEOS layer 12 then is deposited on the structure to act as an etch stop against an etchant used in the subsequently mentioned Metal 2 etching procedure to protect sichrome resistor 10. Then the above-mentioned two-part etching procedure is used to form via openings 16,18 through oxide layer 12 and intermetal dielectric layer 7 to the various Metal 1 conductors 5 and 5A. Referring to FIG. 7, the next step is to perform a photoresist and etching procedure to define the various contact openings 14 to expose contact areas of sichrome resistors such as resistor 10.

Figure 8:
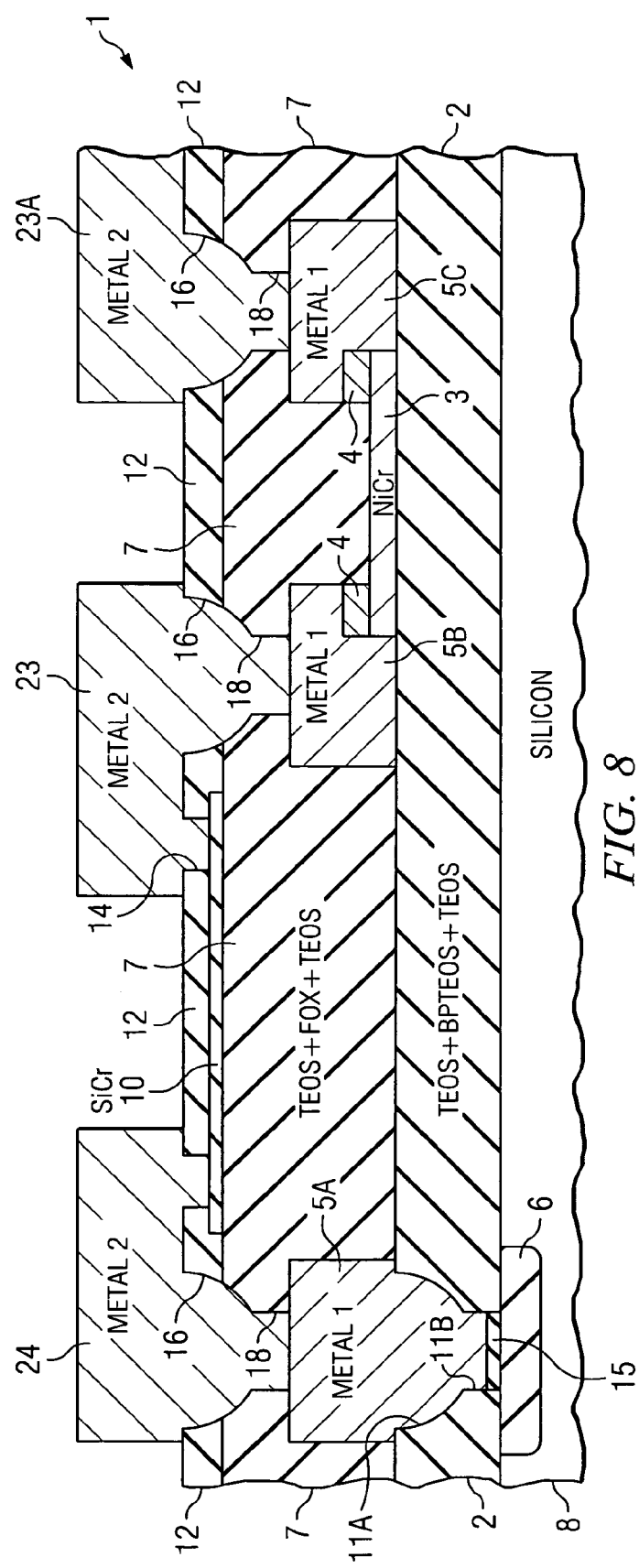

Next, as shown in FIG. 8, a "Metal 2" metallization layer including conductors 23, 23A, and 24 is deposited on the exposed wafer surface, extending through the via openings 16,18 to electrically contact the exposed surfaces of Metal 1 conductors such as conductors 5A-5C, respectively, and some of the Metal 2 conductors also extend through contact openings 14 to the ends of SiCr resistor 10, as shown. A photoresist and etching procedure defines the sizes and shapes of the Metal 2 conductors and results in a structure shown in FIG. 8. (The Metal 1 and Metal 2 layers do not need to be of the same composition or thickness.)

Figure 9:
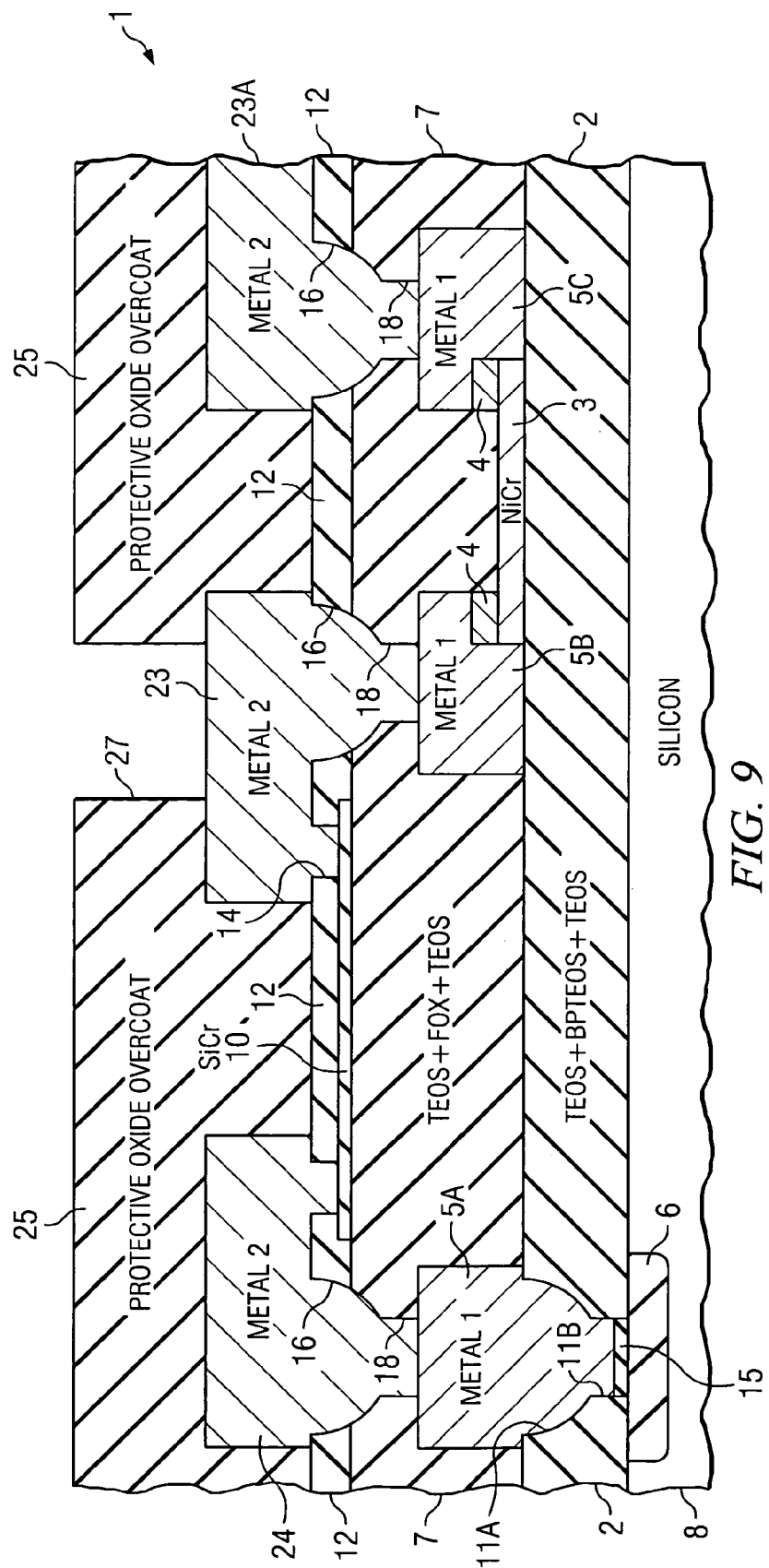

Referring to FIG. 9, the next step is to deposit (or spin on) a protective passivation layer 25, which may be SiON (silicon oxynitride), followed by a photoresist and etching procedure to define bonding pad openings such opening 27. This results in the integrated circuit thin film resistor structure 1 shown in FIG. 9.

An advantage of the structure shown in FIG. 9 is that nichrome resistors can be readily laser trimmed with high accuracy, and the sichrome resistors can be matched with a high degree of precision. (However, the sichrome resistors also can be laser trimmed with relatively high accuracy, although this can be accomplished only with a penalty of sichrome resistor area being increased according to the ratio of the sichrome sheet resistance relative to the nichrome sheet resistance.) This allows the integrated circuit designer increased flexibility by providing two options in selecting the desired thin film resistor component which is best for particular aspects of the circuit design, rather than being limited to use of thin film resistors of only a single available sheet resistance which is optimal in one part of the circuit but is not optimal in another part of the circuit. That is, the invention allows the design engineer to take advantage of two sheet resistances of thin film resistors within the same chip design so that various circuit design attributes can be optimized by using both types of resistors. This allows the designer to choose the best attributes of both types of thin film resistors as needed within the circuit design. The designer does not have to compromise circuit performance as may be the case if only one resistor type is available. Sichrome alloy resistors of high sheet resistance can be selected if high resistance values, long-term stability, and resistor ratio matching are needed, and nichrome alloy resistors can be selected if low resistance values and good laser trimming capability are needed. The nichrome resistors 3 are typically used for lower value resistors having sheet resistances in the range of 50 to 200 ohms per square, and, for example, can be very effectively tuned for RF termination resistors in RF circuitry.

Figure 10:
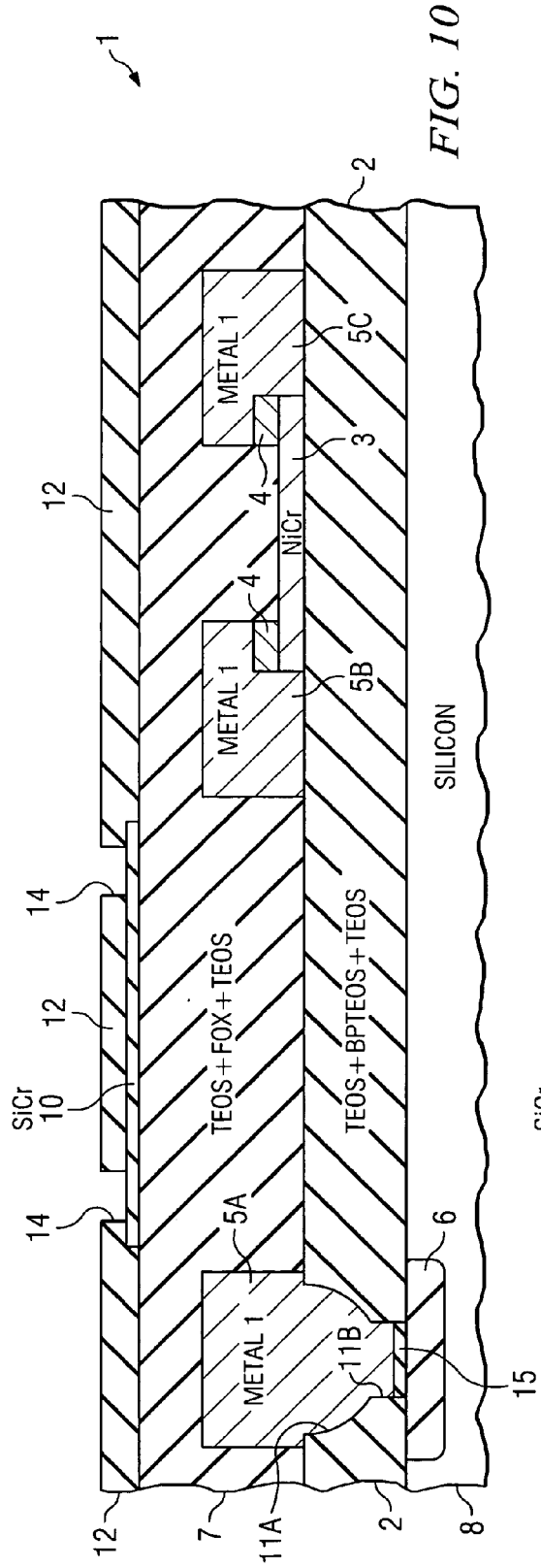
FIGS. 10-13 schematically illustrate four alternative intermediate structures successively produced by a sequence of alternative successive process steps in the formation of a thin film resistor structure according to the present invention.

FIGS. 10-13 schematically illustrate alternative structures resulting from successive process steps which can be used instead of the successive process steps used to form the intermediate structures in above-described FIGS. 6-9. Referring to FIG. 10, after completion of the steps illustrated in FIG. 5, a very thin TEOS layer 12 then is deposited on the structure shown in FIG. 5 to act as an etch stop against an etchant used in the subsequently mentioned Metal 2 etching procedure to protect sichrome resistor 10. Then a photoresist and etching procedure is performed to define the various contact openings 14 to expose contact areas of sichrome resistors such as resistor 10.

Figure 11:
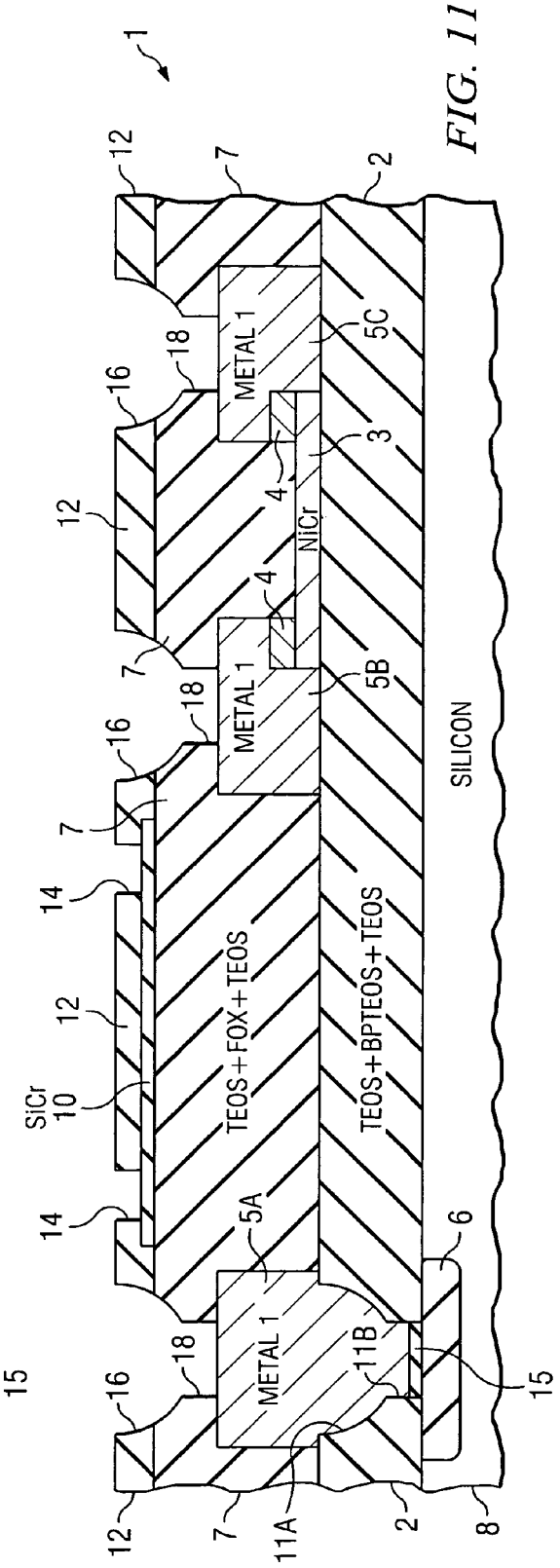

Referring to FIG. 11, the previously mentioned two-part etching procedure is used to form via openings 16,18 through oxide layer 12 and intermetal dielectric layer 7 to the various Metal 1 conductors such as conductors 5A-5C. Thus, the procedure associated with FIGS. 10 and 11 is the reverse of the procedure associated with FIGS. 6 and 7.

Figure 12:
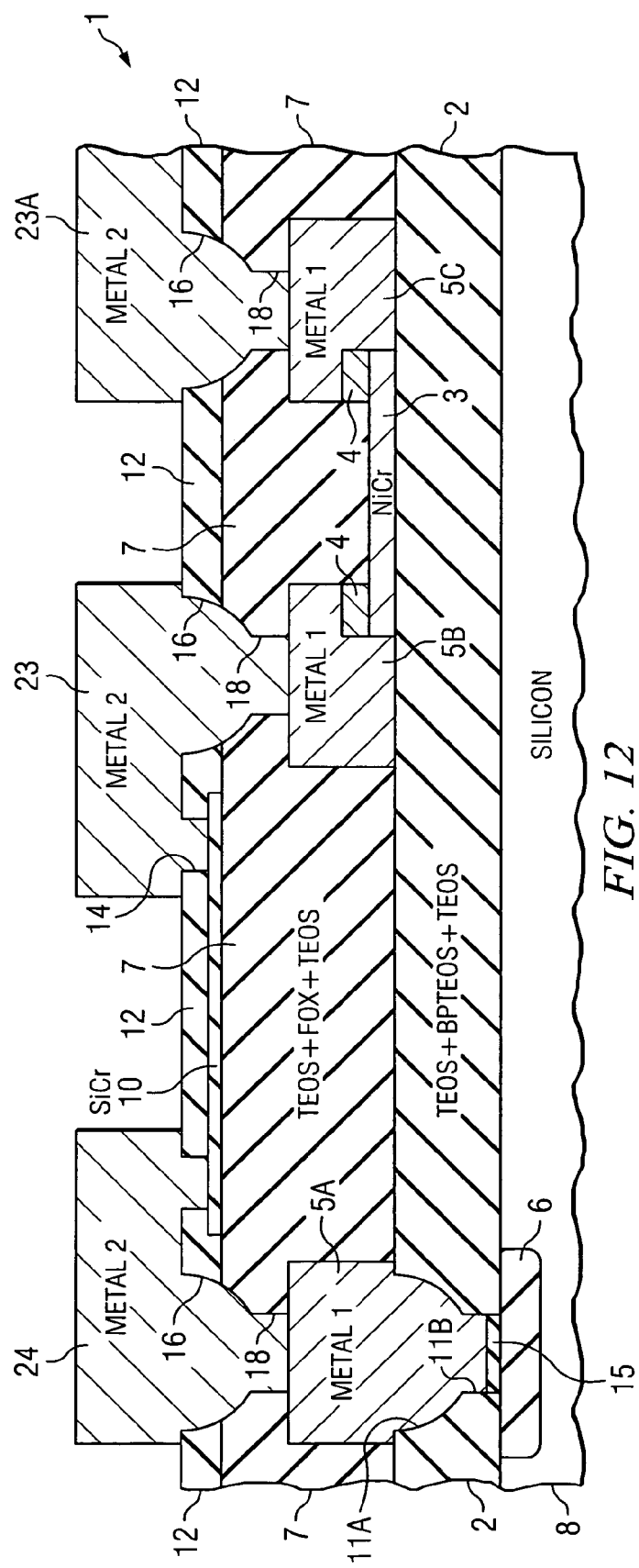

Next, as shown in FIG. 12, a "Metal 2" metallization layer including conductors such as conductors 23, 23A and 24 is deposited on the exposed wafer surface, extending through the via openings 16,18 to electrically contact the exposed surfaces of Metal 1 conductors such as conductors 5A-5C, respectively, and also extending through contact openings 14 to the ends of SiCr resistor 10, as shown. A photoresist and etching procedure defines the sizes and shapes of the Metal 2 conductors and results in the structure shown in FIG. 12. layers do not need to be of the same composition or thickness.

Figure 13:
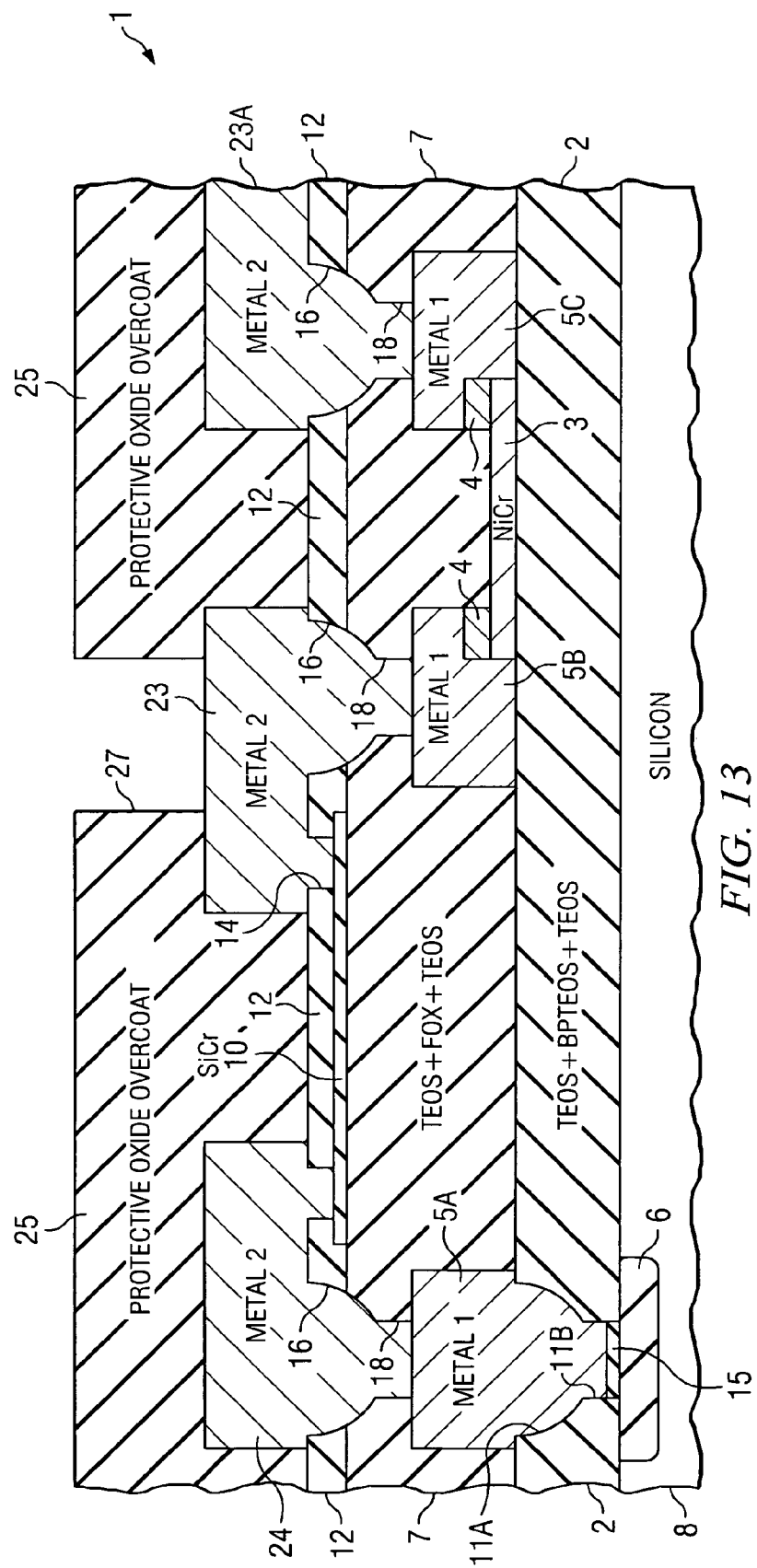

Referring to FIG. 13, the next step is to deposit (or spin on) a protective passivation layer 25, which may be SiON (silicon oxynitride), followed by a photoresist and etching procedure to define bonding pad openings such opening 27. This results in the integrated circuit thin film resistor structure 1 shown in FIG. 13, which is the same as the structure 1 shown in FIG. 9.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, although various oxide layers are disclosed in the described embodiments of the invention, other dielectric layers, such as nitride layers, also can be used. The described structure could be modified by depositing sichrome (rather than nichrome) on pre-metal dielectric layer 2 and later depositing nichrome (rather than sichrome) on intermetal dielectric layer 7. Alternatively, the thin film resistors 3 on pre-metal dielectric layer 2 and the thin film resistors 10 on intermetal dielectric layer 7 could be composed of the same thin film material (which could be nichrome, sichrome, tantalum nitride, or other thin film material).

What is claimed is:

1. A method of making an integrated circuit, comprising:
   (a) forming a circuit element in a semiconductor layer and a first thin film resistor on a first dielectric layer on the semiconductor layer;
   (b) forming a first layer of interconnect conductors on the first dielectric layer including a first interconnect conductor electrically contacting a first contact area of the first thin film resistor, a second interconnect conductor electrically contacting a second contact area of the first thin film resistor, and a circuit element interconnect conductor extending through a first opening in the first dielectric layer and directly contacting a contact area of the circuit element, wherein the first opening in the first dielectric layer extends to the contact area of the circuit element;
   (c) forming a second dielectric layer on the first dielectric layer, the first thin film resistor, and the first layer of interconnect conductors;
   (d) forming a second thin film resistor on the second dielectric layer;
   (e) forming a third dielectric layer on the second dielectric layer and the second thin film resistor; and
   (f) forming a second layer of interconnect conductors on the third dielectric layer including a third interconnect conductor extending through a first opening in the second and third dielectric layers to contact the first interconnect conductor, a fourth interconnect conductor extending through a second opening in the second and third dielectric layers to contact the second interconnect conductor, and a fifth interconnect conductor extending through a third opening in the second and third dielectric layers to contact the circuit element interconnect conductor, wherein the fifth interconnect conductor and one of the third and fourth interconnect conductors extend through first and second openings in the third dielectric layer to first and second contact areas, respectively, of the second thin film resistor.

2. The method of claim 1 wherein step (a) includes forming the first thin film resistor of nichrome.

3. The method of claim 2 wherein step (d) includes forming the second thin film resistor of sichrome.

4. The method of claim 1 wherein at least one of the first and second thin film resistors is composed of one of the group including sichrome (SiCr), nichrome (NiCr) and tantalum nitride (TaN).

5. The method of claim 1 including forming a metal silicide layer on the contact area of the circuit element before forming the circuit element interconnect conductor.

6. The method of claim 1 including forming the first thin film resistor of nichrome and forming the second thin film resistor of sichrome wherein the nichrome has a sheet resistance in the range of 30 to 300 ohms per square and the sichrome has a sheet resistance in the range of 300 to 2000 ohms per square.

7. The method of claim 1 including forming the first and second openings in the second and third dielectric layers to contact the first and second interconnect conductors, respectively, and then forming the first and second openings in the third dielectric layer to the first and second contact areas, respectively, of the second thin film resistor, before step (f).

8. The method of claim 1 including forming the first and second openings in the third dielectric layer to the first and second contact areas, respectively, of the second thin film resistor, and then forming the first and second openings in the second and third dielectric layers to contact the first and second interconnect conductors, respectively, before step (f).

* * * * *